United States Patent [19]
Thompson et al.

[11] Patent Number: 6,127,826
[45] Date of Patent: Oct. 3, 2000

[54] EPI IMAGE BASED LONG TERM EDDY CURRENT PRE-EMPHASIS CALIBRATION

[75] Inventors: Michael R. Thompson, Cleveland; Mark J. Loncar; Wayne R. Dannels, both of Richmond Heights; Heidi A. Schlitt, Chesterland, all of Ohio

[73] Assignee: Picker International, Inc., Highland Heights, Ohio

[21] Appl. No.: 09/238,397

[22] Filed: Jan. 27, 1999

[51] Int. Cl.[7] ..................................................... G01V 3/00
[52] U.S. Cl. ........................... 324/307; 324/309; 324/322
[58] Field of Search ................................... 324/307, 309, 324/322, 318

[56] References Cited

U.S. PATENT DOCUMENTS

| | | | |
|---|---|---|---|
| 4,585,995 | 4/1986 | Flugan | 324/322 |
| 4,698,591 | 10/1987 | Glover et al. | 324/307 |
| 4,703,275 | 10/1987 | Holland | 324/318 |
| 4,761,612 | 8/1988 | Holland et al. | 324/307 |
| 4,928,063 | 5/1990 | Lampman et al. | 324/307 |
| 5,025,217 | 6/1991 | Van Vaals | 324/322 |
| 5,451,877 | 9/1995 | Weissenberger | 324/322 |

OTHER PUBLICATIONS

Jezzard, Barnett, Pierpaoli, "Characterization of and Correction for Eddy Current Artifacts in Echo Planar Diffusion Imaging," *Magnetic Resonance in Medicine*, vol. 39, pp. 801–812, 1998.

Alexander, Tsuruda, Parker, "Elimination of Eddy Current Artifacts in Diffusion–Weighted Echo–Planar Images: the Use of Bipolar Gradients," *Magnetic Resonance in Medicine*, vol. 38, pp. 1016–1021, 1997.

Haselgrove, Moore, "Correction for Distortion of Echo–Planar Images Used to Calculate the Apparent Diffusion Coefficient," *Magnetic Resonance in Medicine*, vol. 36, pp. 960–964, 1996.

*Primary Examiner*—Christine K. Oda
*Assistant Examiner*—Brij B. Shrivastav
*Attorney, Agent, or Firm*—Fay, Sharpe, Fagan, Minnich & McKee, LLP

[57] ABSTRACT

A method of calibrating pre-emphasis gradient pulse conditioning for long term eddy current compensation in an MRI system is provided. It includes positioning an object in the MRI system for imaging therewith. A long term eddy current generating pre-scan gradient pulse is applied, and after a delay, an EPI sequence is run such that a resulting image of the object is acquired. This process of applying the pre-scan gradient pulse followed by the EPI sequence is repeated while varying the delay therebetween. Size variations in the resulting images of the object are observed, and these size variations are fit to an exponential curve to obtain one or more time constants for the long term eddy currents. Next, a reference EPI sequence is run without applying the long term eddy current generating pre-scan gradient pulse such that a reference image of the object is acquired. The long term eddy current generating pre-scan gradient pulse is reintroduced, and after a delay which is shorter than the time constants, a test EPI sequence is run such that a test image of the object is acquired. The process of applying the pre-scan gradient pulse followed by the test EPI sequence is repeated while adjusting the pre-emphasis gradient pulse conditioning which is based upon the time constants obtained. This continues until the test images of the object have a size substantially equivalent to that of the reference image.

19 Claims, 3 Drawing Sheets

EPI IMAGE BASED LONG TERM EDDY CURRENT PRE-EMPHASIS CALIBRATION

BACKGROUND OF THE INVENTION

The present invention relates to the art of medical diagnostic imaging. It finds particular application in conjunction with magnetic resonance imaging (MRI), and will be described with particular reference thereto. However, it is to be appreciated that the present invention is also amenable to other like applications.

In magnetic resonance imaging systems, gradient coil assemblies are commonly pulsed with electrical current pulses to produce magnetic gradients across a main magnetic field in the vicinity of an imaging region. The magnetic field gradients tend to interact with external metallic structures such as the magnet cold shields, the magnet dewar, and the like. This interaction generates eddy currents in the affected structures. These eddy currents, in turn, generate eddy magnetic fields which have a deleterious effect on the temporal and spatial quality of the magnetic field in the vicinity of the imaging region and, hence, in the resultant image quality.

To compensate for long term eddy currents (i.e., eddy currents with time constants that are not short compared to an echo planar imaging (EPI) readout time, for example, on the order of or longer than the EPI readout time), typically, pre-emphasis hardware shapes gradient pulses and/or applies pre-emphasis currents to the gradient coils to counter the eddy currents. To adequately compensate for the long term eddy currents, it is advantageous to have the pre-emphasis hardware correctly calibrated.

Previous methods for achieving the desired calibration relied on an eddy current generating pre-scan gradient pulse followed by free induction decay (FID) readouts. Information regarding the time constants of the induced eddy currents was then extracted from the FID signal. The time constants could then be used to measure and correct for long term eddy currents via calibration of the pre-emphasis filters and/or currents. While generally sufficient for their relative applications, the prior art techniques suffer from various drawbacks. A noteworthy drawback is that the results are not image based, and as such, they are difficult to interpret by persons without some advanced mathematical background. Moreover, they lack the ability to easily quantify the effect of the residual eddy currents on images.

One type of prior art technique employs a specialized probe or small phantom in its calibration method. See, for example, U.S. Pat. No. 4,698,591, incorporated herein by reference. The probe is initially offset from the isocenter of the imaging region to be positioned where the gradient to be compensated is non-zero. Drawbacks to this particular method are that the specialized probe or small phantom is not widely available and that it is manually repositioned in order to obtain localized spatial information. Other prior methods have addressed these issues by employing a larger phantom and exciting only selected cross-sections thereof via application of a slice select gradient. See, for example, U.S. Pat. No. 5,451,877, incorporated herein by reference. Such methods, however, suffer from their own drawbacks. In the case of a spherical phantom, the spurious gradients generated by the eddy currents are integrated over a whole disk and not merely the axis of interest. Additionally, for localized spatial information, multiple experiments on different selected slices are performed. Moreover, the employment of the slice selection gradient tends to complicate matters as it introduces eddy current effects of its own.

Other efforts to address eddy current problems include using an imaging technique know as diffusion-weighted echo planar imaging (DWI). Again, however, DWI has certain drawbacks associated therewith. Of note is the fact that the time constant range of eddy currents which may accurately be observed using DWI is limited by the duration of the diffusion-weighting lobes. Moreover, DWI images have signal-to-noise limitations induced by the diffusion weighting, and scans collected with varying B-values have different base signal-to-noise ratios which makes comparison of images difficult.

The present invention contemplates a new and improved technique for long term eddy current pre-emphasis calibration which overcomes the above-referenced problems and others.

SUMMARY OF THE INVENTION

In accordance with one aspect of the present invention, a method of calibrating pre-emphasis gradient pulse conditioning for long term eddy current compensation in an MRI system is provided. It includes positioning an object in the MRI system for imaging therewith. A long term eddy current generating pre-scan gradient pulse is applied, and after a delay, an EPI sequence is run such that a resulting image of the object is acquired. This process of applying the pre-scan gradient pulse followed by an EPI sequence is repeated while varying the delay therebetween. Size variations in the resulting images of the object are observed. These size variations are then fit to an exponential curve to obtain one or more time constants for the long term eddy currents. Next, a reference EPI sequence is run without applying the long term eddy current generating pre-scan gradient pulse such that a reference image of the object is acquired. The long term eddy current generating pre-scan gradient pulse is reintroduced, and after a delay which is shorter than the time constants, a test EPI sequence is run such that a test image of the object is acquired.

Again, the process of applying the pre-scan gradient pulse followed by the test EPI sequence is repeated while adjusting the pre-emphasis gradient pulse conditioning which is based upon the time constants obtained. This continues until the test images of the object have a size substantially equivalent to that of the reference image.

In accordance with a more limited aspect of the present invention, the method is repeated for three mutually orthogonal axes wherein each axis thereof is selected in turn.

In accordance with a more limited aspect of the present invention, a phase encode direction of the EPI sequence is aligned with the axis selected.

In accordance with a more limited aspect of the present invention, the long term eddy current generating pre-scan gradient pulses are applied to the axis selected.

In accordance with a more limited aspect of the present invention, the long term eddy current generating pre-scan gradient pulses are applied to one of the three mutually orthogonal axes other than the phase encode axis such that cross terms resulting from the long term eddy currents are observed and accounted for.

In accordance with a more limited aspect of the present invention, the observed size variations are in the phase encode direction.

In accordance with a more limited aspect of the present invention, the method excludes the adjustment step and is employed to verify accurate calibration of the pre-emphasis gradient pulse conditioning by comparing sizes of the test and reference images such that when they are within a desired tolerance, accurate calibration is verified.

In accordance with a more limited aspect of the present invention, the method further includes acquiring a first subtraction image using an EPI sequence preceded by a positive polarity long term eddy current generating pre-scan gradient pulse. Additionally, a second subtraction image is acquired using an EPI sequence preceded by a negative polarity long term eddy current generating pre-scan gradient pulse. The first and second subtraction images are subtracted and the results observed to determine if the long term eddy currents exhibit any spatial localizations.

In accordance with a more limited aspect of the present invention, two time constants for the long term eddy currents are obtained.

In accordance with another aspect of the present invention, in an MRI apparatus including pre-emphasis hardware which conditions electrical pulses from gradient amplifiers to suppress effects of long term eddy currents, a pre-emphasis calibration system that adjusts the conditioning performed by the pre-emphasis hardware is provided. It includes a sequence control circuit which manipulates a magnetic gradient generator, a radio frequency transmission system, and a radio frequency reception system to produce images of an object present in the MRI apparatus. The sequence control circuit runs at least a plurality of EPI scans preceded by long term eddy current generating pre-scan gradient lobes, and a reference EPI scan with no long term eddy current generating pre-scan gradient lobe. It also includes a pre-emphasis calibration circuit which adjusts the pre-emphasis hardware in accordance with artifacts observed in images of the object.

In accordance with a more limited aspect of the present invention, the artifacts observed include size changes along a phase encode direction resulting from spurious gradients along the phase encode direction.

In accordance with a more limited aspect of the present invention, the artifacts observed include image shear in a phase encode direction resulting from spurious gradients along a readout direction.

One advantage of the present invention is that it is an image-based technique which is easy for technicians to employ.

Another advantage of the present invention is that it allows for monitoring of cross terms.

Yet another advantage of the present invention is that spatially localized information about eddy current magnitudes is obtained and utilized to locate and address eddy current sources and magnet trouble spots.

Another advantage of the present invention is that the method is quickly run thereby shortening set-up time and/or verifications.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
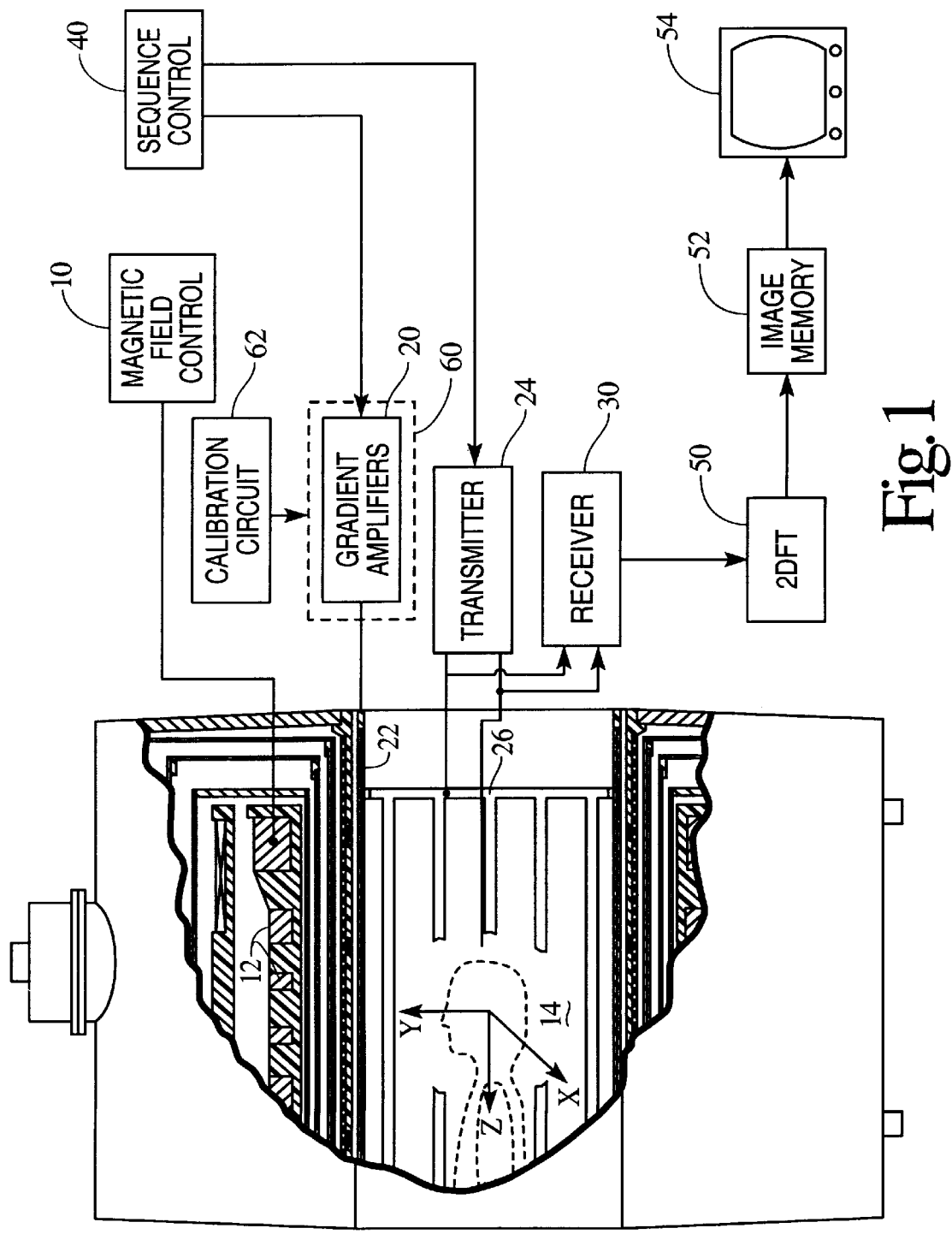
FIG. 1 is a diagrammatic illustration of a magnetic resonance imaging apparatus in accordance with aspects of the present invention.

With reference to FIG. 1, a main magnetic field control 10 controls superconducting or resistive magnets 12 such that a substantially uniform, temporally constant main magnetic field is created along a z axis through an examination region 14. A couch (not illustrated) suspends an object to be examined, such as a patient or phantom, within the examination region 14. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences. More specifically, gradient pulse amplifiers 20 apply current pulses to selected ones or pairs of gradient coil assemblies 22 to create magnetic field gradients along x, y, and z axes of the examination region 14. A digital radio frequency transmitter 24 transmits radio frequency pulses or pulse packets to a whole-body RF coil 26 to transmit RF pulses into the examination region. A typical radio frequency pulse is composed of a packet of immediately contiguous pulse segments of short duration, which taken together with each other and any applied gradients, achieve a selected magnetic resonance manipulation. For whole-body applications, the resonance signals are commonly picked up by the whole-body RF coil 26.

For generating images of local regions of the subject, specialized radio frequency coils are placed contiguous to the selected region of interest. For example, an insertable RF coil may be inserted surrounding a selected region at the isocenter of the bore. The insertable RF coil is used to excite magnetic resonance and receive magnetic resonance signals emitting from the patient in the region being examined. Alternatively, the insertable RF coil can be used to only receive resonance signals introduced by the whole-body RF coil 26. In any event, the resultant radio frequencies signals are picked up by the whole-body RF coil 26, the insertable RF coil, or other specialized RF coil and demodulated by a receiver 30, preferably a digital receiver.

A sequence control circuit 40 controls the gradient pulse amplifiers 20 and the transmitter 24 to generate any of a plurality of multiple echo sequences such as echo planar imaging (EPI), echo volume imaging, gradient and spin echo imaging, fast spin echo imaging, and the like. For the selected sequence, the receiver 30 receives a plurality of data lines in rapid succession following each RF excitation pulse. Ultimately, the radio frequency signals are received, demodulated, and reconstructed into an image representation by a reconstruction processor 50 which applies a two-dimensional Fourier transform or other appropriate reconstruction algorithm. The image may represent a planar slice through the patient, an array of parallel planar slices, a three-dimensional volume, or the like. The image is then stored in an image memory 52 where it may be accessed by a display, such as a video monitor 54 which provides a human readable display of the resultant image.

Pre-emphasis hardware 60 such as pre-emphasis filters or wave form generators selectively shape the gradient pulses from the gradient amplifiers 20 and/or apply pre-emphasis currents superimposed over and/or in conjunction with the gradient pulses in such a manner that long term eddy current effects are compensated for. A pre-emphasis calibration circuit 62 controls the calibration of the pre-emphasis hardware 60 as described below. Optionally, the pre-emphasis calibration circuit 62 and/or the pre-emphasis hardware 60 are implemented as either hardware configurations, software configurations, or combinations of both.

While the invention herein is described with reference to the MRI apparatus detailed above, it is appreciated that the invention is applicable to other MRI apparatus. For example, the invention is equally amenable to open geometry magnets wherein opposing pole pieces, joined by a ferrous flux return path, define an examination region therebetween.

Figure 2:
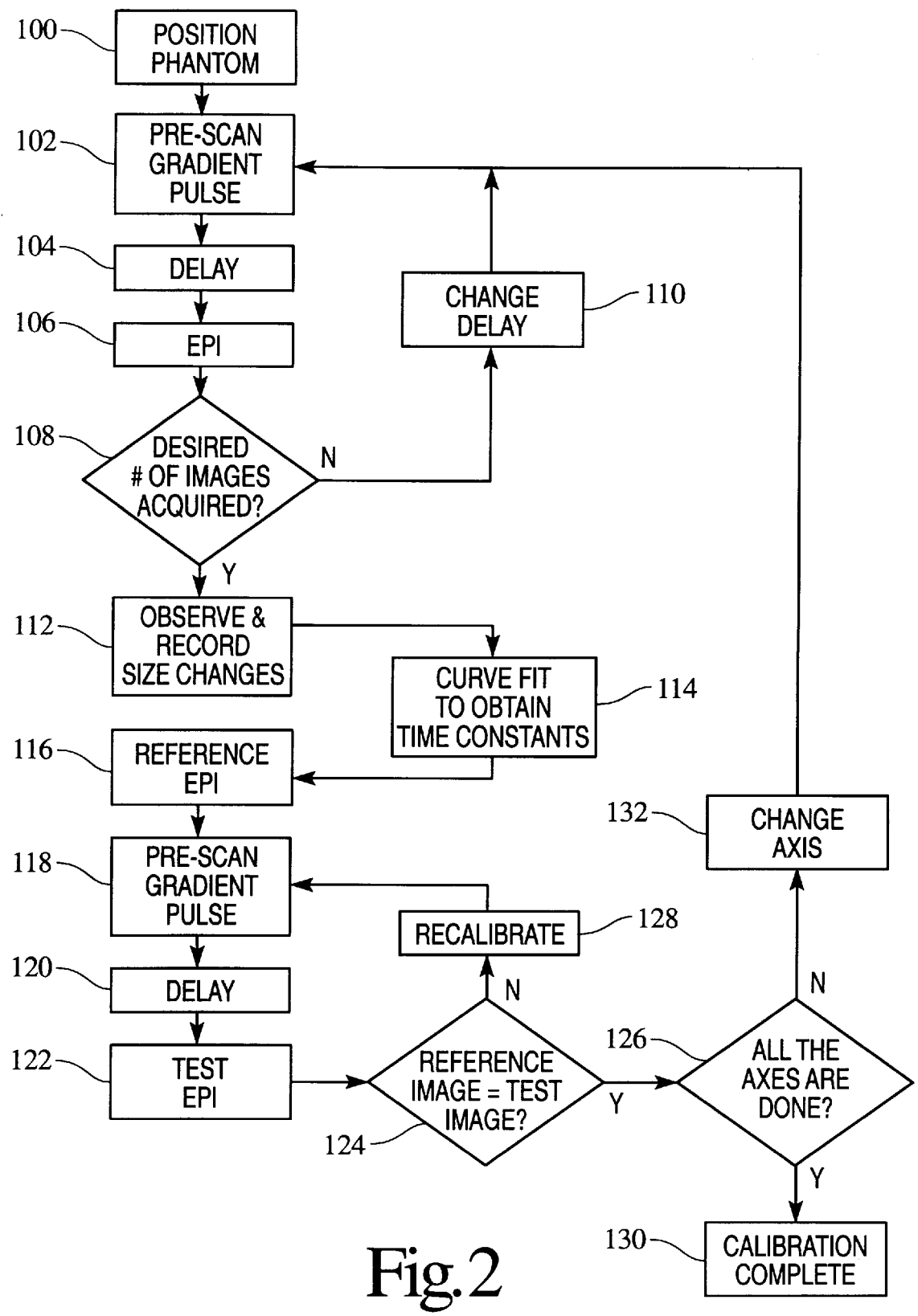
FIG. 2 is a flow chart illustrating a long term eddy current pre-emphasis calibration technique in accordance with aspects the present invention; and, FIG. 3 is an illustration of a pulse sequence for generating and acquiring magnetic resonance signals used to calibrate long term eddy current compensating pre-emphasis in accordance with aspects the present invention.

With reference to FIG. 2 and continuing reference to FIG. 1, a flow chart illustrates a preferred method for calibrating the pre-emphasis hardware 60. Initially, as shown at step 100, a phantom is centered or otherwise position in the examination region 14. In a preferred embodiment, the phantom is spherical. At step 102, a long term eddy current generating pre-scan gradient pulse or lobe is applied preferably along one of the three mutually orthogonal axes, x, y, or z, which is also designated as the phase encode (PE) direction. A variable delay is introduced at step 104 which is then followed by a standard EPI sequence and/or scan at step 106 such that an image of the phantom is acquired. At inquiry 108, it is determine whether or not the desired number of EPI images has been acquired. The desired number is optionally user selectable or predetermined. In a preferred embodiment, about 15 images are acquired. If the desired number of images have not been collected, the process loops back to step 102 via step 110 wherein the length of the delay imposed at step 104 is changed. Again, the change in delay is optionally user selectable or predetermined.

On the other hand, where a sufficient number of images have been collected, the process continues on to step 112 where size changes and/or variations along the PE direction of the acquired images are observed (as detailed later herein) and recorded. These size changes and/or variations are a function of the delay imposed at step 104.

At step 114, the size changes vs. the delay times are fit to an exponential curve and decay time constants, preferable one or two, for the long term eddy currents generating spurious gradients in the PE direction are determined. Alternately, in a preferred automated embodiment, steps 112 and 114 precede the inquiry 108 and at the inquire 108 the process only fails to loop back when sufficient data is obtained such that the fits performed at step 114 are within a predetermined or selectable range of error. Optionally, a failsafe is employed which breaks out of the loop after so many iterations have been completed and the range is still not reached.

In any event, after the time constant(s) have been determined the method continues with step 116 wherein another EPI sequence and/or scan is performed without a pre-scan gradient pulse or lobe such that a reference image is acquired.

In the next step 118, the long term eddy current generating pulse is reintroduced followed by a delay at step 120 and subsequently, at step 122, by another EPI sequence or scan which leads to the acquisition of a test image. The delay imposed at step 120 is relatively short as compared to the time constant(s) determined earlier. In this manner, it is assured that the eddy currents will not have decayed by the time the EPI sequence or scan is run at step 122. At the next inquire 124, it is determined if the test image has substantially the same size (i.e., within a certain tolerance) as the reference image along the PE direction. If they are within tolerance, the calibration along the chosen axis (i.e., the x, y, or z axis chosen in step 102) is complete and the process proceeds to the following inquire 126. Otherwise, the pre-emphasis hardware 60 is recalibrated at step 128 and another test image is acquired via steps 118 through 120. The recalibration depends on the particular pre-emphasis hardware 60 employed and takes the form of an adjustment to the pre-emphasis conditioning of the applied gradient pulses, such as an adjustment to: the magnitude of the pre-emphasis current applied, the pre-emphasis filter, the magnitude of the wave form generated, and/or other like adjustments. In any event, the adjustments made are consistent with the time constant(s) of the eddy current which have already been determined. In a preferred embodiment, the image comparisons and recalibrations are made on the fly as test images are iteratively acquired.

At inquire 126, it is determined whether or not calibration for all the axes, x, y, and z, has been completed. If so calibration is complete and, at step 130, an indication thereof is made. Otherwise, at step 132 the axis is changed (i.e., the PE direction is aligned along another of the x, y, or z axes and the long term eddy current generating pre-scan gradient pulse or lobe is also applied thereto) and the process restarted at step 102. In addition to being an accurate calibration method, the above technique is also optionally employed as a fast (typically less than 1 minute run time) verification procedure run as a quality assurance scan to ensure that the effects of the long term eddy currents continue to be accurately suppressed. Moreover, verification and correction for cross terms is also an option. The cross terms represent spurious gradients which are created in an orthogonal direction to that along which the pre-scan long term eddy current generating gradient pulse or lobe is applied. For example, the PE direction may be aligned along one of the x, y, or z axis while the pre-scan gradient pulse or lobe is applied in another direction. In this manner, the contributions, if any, to spurious gradients along one direction which are generated due to eddy currents generated via a pre-scan gradient pulse or lobe along an orthogonal direction are accounted for. Therefore, optionally, the technique is employed nine times to account for the PE direction being aligned with each of the three axes and for each PE direction the pre-scan gradient pulse or lobe being applied to each of the three axes.

Figure 3:
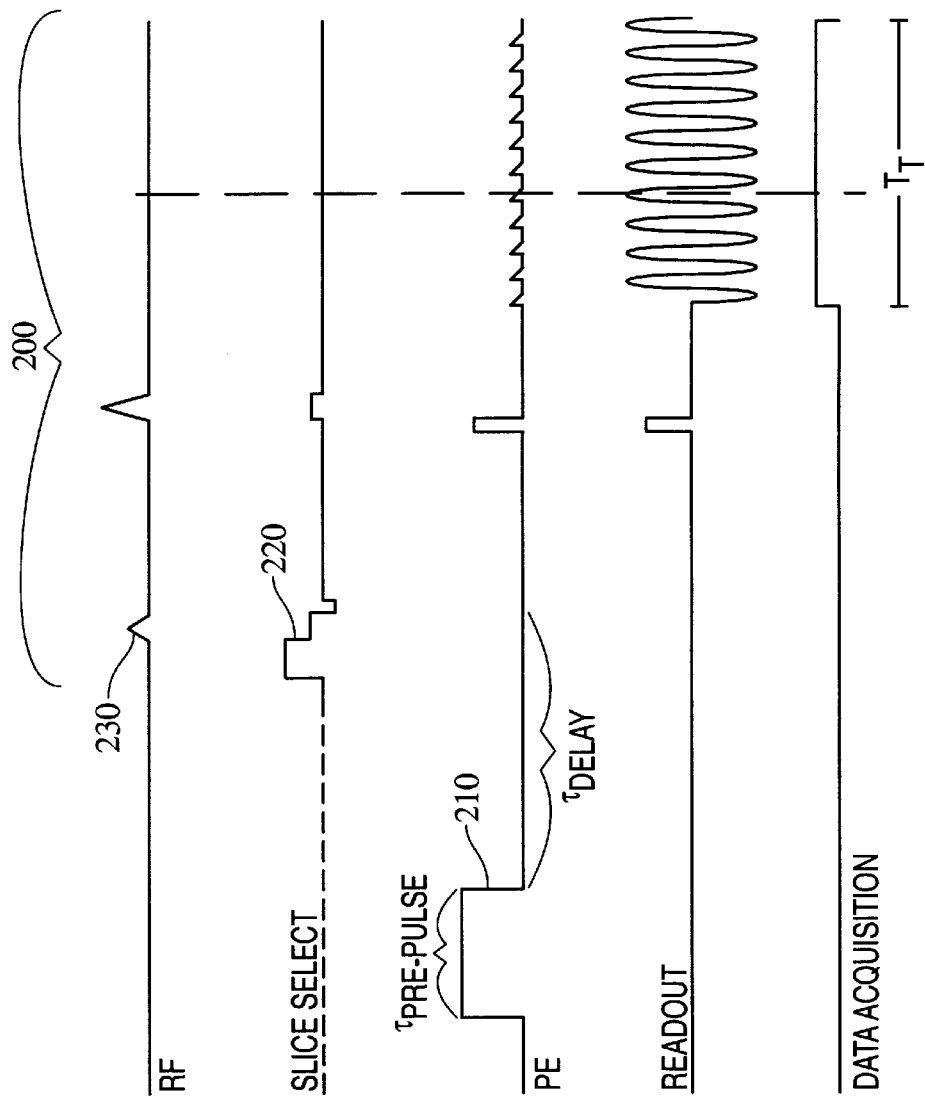

With reference to FIG. 3 and continuing reference to FIGS. 1 and 2, the theory behind the above describe technique is more fully detailed with particular attention to the illustrated exemplary pulse sequence.

To summarize generally, in a preferred embodiment, a single, long-duration, unipolar gradient pulse (i.e., the pre-scan gradient pulse or lobe) is placed before a conventional EPI imaging readout. Long term eddy currents generated by the pre-scan gradient give rise to small additional gradients that lead to quantifiable distortions in the resulting EPI image. Spurious gradients along the phase encode direction result in FOV changes (i.e., size changes in the PE direction); in addition, spurious gradients along the read direction lead to shearing in the image, and spurious gradients in the slice select direction can lead to signal loss and/or displacements of the entire image. By varying the delay between the pre-scan gradient pulse and the EPI readout, the time constants of the eddy currents are measured. The magnitude of the spurious gradients is found by measuring image size variations. Using this information, pre-emphasis hardware 60 is calibrated to reduce the effect of long term eddy currents on subsequent imaging experiments. Finally, this sequence is optionally run at any time to quickly re-evaluate the quality of long term eddy current compensation on the MRI system.

EPI imaging has historically been plagued by severe image artifacts due to hardware limitations and susceptibility differences in the object being imaged. Over time, the sources of many artifacts due to hardware limits have been identified, and in most cases, removed or reduced. Conversely, where particular artifacts are observed in EPI images, they can be used to identify and characterize the sources of the errors that produced them. Such an application, including the quantification and subsequent correction of long term eddy currents in an MRI system, is employed here.

EPI makes use of extremely small gradients for phase encoding. Therefore, any small spurious gradients present along the PE direction lead to relatively large effects in the image. Spurious gradients as small as 0.01 mT/m lead to image variations that are easily detectable upon visual inspection. Where the source of the spurious gradients is assumed to be due to eddy currents induced by previous gradient pulses, the EPI image variations can and are used to probe the time constant(s) and the magnitude(s) of the background gradients, provided their time constant is not short compared to the EPI readout time $T_T$. In order to produce such spurious gradients, a conventional EPI sequence 200 is preceded by an eddy current generating gradient lobe 210.

A primary advantage of this image-based method to identify and correct for long term eddy currents is that it is directly related to image quality, and easier to evaluate by MR technicians who spend a large amount of their time evaluating images. Another advantage is that the results are easily quantified. Relative size changes in the image are used to obtain the magnitude of the background eddy currents that generated the changes. Moreover, optionally these results are used to predict whether the eddy currents are large enough to affect frequency-sensitive MRI methods, such as radio frequency fat saturation. Also, localized spatial information from the images is obtained.

Since EPI makes use of such long readout periods, small background gradient effects lead to large effects in the resulting images. Significant image size scaling is seen due to very small background gradients along the PE direction. Significant image shearing is also seen due to similarly small background gradients along the read direction.

In more mathematical terms, using Nyquist arguments, it is possible to understand how the FOV changes due to spurious background gradients. In the absence of any background gradients, the phase encoding k-space step accumulated between each readout line is derived as follows:

$$\Delta k_{pe} = \Upsilon \int_0^{\tau_{blip}} dt' G_{pe}(t'), \quad (1)$$

and for the case where the phase encode gradient lobes are half sinusoids:

$$\Delta k_{pe} = \Upsilon \frac{2}{\pi} G_{max,pe} \tau_{blip} \quad (2)$$
$$= \frac{1}{FOV_{pe}},$$

where $\Upsilon$ represents the gyromagnetic ratio over $2\pi$, $\tau_{blip}$ represents the duration of the phase encode gradient lobe, $G_{pe}$ represents the magnitude of the PE gradient, $FOV_{pe}$ represents the field of view in the direction of the subscript, and $G_{max,pe}$ represents the peak magnitude of the PE gradient lobe.

Where a background gradient exists between the PE gradient lobes, however, the effective values of $\Delta k_{pe}$ are increased or decreased, depending upon the magnitude of the background gradient. The change of the phase encoding step size is proportional to $\Upsilon$ times the time-integral of the spurious gradient between the PE gradient lobes and is given mathematically as follows:

$$\Delta k'_{pe} = \Upsilon \int_0^{\tau_{blip}} dt' G_{pe}(t') + \Upsilon \int_0^{\tau_{read\ lobe}} dt' G'_{pe}(t') \quad (3)$$
$$\approx \Upsilon \frac{2}{\pi} G_{max,pe} \tau_{blip} + \Upsilon G'_{pe} \tau_{read\ lobe}$$

assuming $G'_{pe}$ is constant in time $$= \frac{1}{FOV'_{pe}},$$

where $\tau_{read\ lobe}$ represents the duration of the gradient lobe in the readout direction, and primed terms for $\Delta k_{pe}$, $G_{pe}$, and $FOV_{pe}$ represent their respective new values.

This spurious gradient also leads to a tipping of the readout lines into the PE direction during readout, which leads to some shear in the resulting image, but due to the large magnitude of the readout gradient, this effect is generally quite small. In terms of the displayed image, ideally, for a given phase encode direction y:

$$FOV_{pe} = N\Delta y \quad (4),$$

but, in fact, the results are given by:

$$FOV_{pe}' = N\Delta y' \quad (5),$$

where N is the total number of pixels along the phase encode direction. Using this knowledge, objects measured in the image are used to measure the FOV change, and, hence, the magnitude of the background gradient. Consider a physical object with length $L_{obj}$ along the PE direction, then:

$$L_{obj} = n_{obj} \Delta y \quad (6)$$
$$= n_{obj} \frac{FOV_{pe}}{N},$$

where $n_{obj}$ represents the number of sample point over the length of the object and $\Delta y$ represents each individual sample width; therefore, from equation (6), the following is derived:

$$n_{obj} = L_{obj} N \frac{1}{FOV_{pe}}, \quad (7)$$

so that the number of pixels an object occupies in an image is inversely proportional to the $FOV_{pe}$ change, and $$\frac{FOV_{pe}}{FOV'_{pe}} = \frac{n'_{obj}}{n_{obj}}. \quad (8)$$

Combining equations (2) and (3), it is then found that:

$$\frac{FOV_{pe}}{FOV'_{pe}} = \left[1 + \frac{\pi}{2} \frac{G'_{pe} \tau_{readlobe}}{G_{max,pe} \tau_{blip}}\right] \quad (9)$$

$$\frac{n'_{obj}}{n_{obj}} = \left[1 + \frac{\pi}{2} \frac{G'_{pe} \tau_{readlobe}}{G_{max,pe} \tau_{blip}}\right],$$

and working backward from measured objects in the image, $G_{pe}^{51}$ is found according to the following equation:

$$G'_{pe} = \left[\frac{n'_{obj}}{n_{obj}} - 1\right] \frac{G_{max,pe} \tau_{blip}^2}{\pi \tau_n}. \quad (10)$$

Based upon the value of $G_{pe}'$ then, the frequency spread across the imaging region, or an individual region is determined in accordance with the following equation:

$$\Delta f_{G'_{pe}} = \Upsilon G'_{pe} \cdot DSV, \quad (11)$$

where DSV is the diameter spherical volume of the imaging region. In an alternate embodiment, this frequency spread is used to predict whether or not significant signal loss, due to dephasing, should be expected, or over what regions fat-sat pulses may be effective by comparing $\Delta f_{fat,water}$ to $\Delta f_{G'_{pe}}$.

Alternately, if a small, constant background exists along the read gradient direction, significant shearing is found in the image. Although the background gradient affects the magnitude of the read gradient, $G_{rd}$, in each read line, due to the large magnitude of the applied readout gradients, the effect in each individual line is small compared to the echo shift effect. If a constant background gradient, $G_{rd}'$, exists along the read direction, it continues to shift the $k_{read}=0$ point farther, and farther of f from the assumed center of the readout line. This "tilting" of k-space along the read direction leads to shear along the PE direction in the resulting images. In an alternate embodiment, based on the amount of shear observed, the eddy currents that are generating the spurious gradients are compensated for via calibration of the pre-emphasis hardware 60.

The phase developed at echo number $n_y$ along the phase encode direction, for a spin echo readout, is given by:

$$\phi(n_y \tau_{readlobe}) = \Upsilon \frac{2}{\pi} G_{pe,max} n_y \tau_{blip} \cdot y + \Upsilon G'_{rd} n_y \tau_{read\ lobe} \cdot x \quad (12)$$

-continued $$= 2\pi \left(\Upsilon n_y G_{max,pe} \tau_{blip} \frac{2}{\pi}\right) \cdot \left[y + \frac{G'_{rd} \tau_{readlobe}}{\frac{2}{\pi} G_{pe,max} \tau_{blip}} x\right]$$

$$= 2\pi k_y \left[y + \frac{G'_{rd} \tau_{read\ lobe}}{\frac{2}{\pi} G_{pe,max} \tau_{blip}} x\right].$$

Therefore, in the resulting image, the following is obtained:

$$y \rightarrow y + \frac{G'_{rd} \tau_{readlobe}}{\frac{2}{\pi} G_{pe,max} \tau_{blip}} x. \quad (13)$$

The fact that y shifts as a function of x leads to a shear in the resulting image.

To utilize EPI in probing long term eddy currents, a modified EPI sequence is employed. The sequence modification is a pre-scan gradient pulse or lobe 210, placed before the slice-select excitation pulse 220. The purpose of the pre-scan gradient pulse or lobe 210 is to generate long term eddy currents. The duration ($\tau_{pre-pulse}$) of the pre-scan gradient pulse or lobe 210, as well as the delay ($\tau_{delay}$) between the end of the pre-scan gradient pulse 210 and the radio frequency (RF) excitation pulse 230 is varied to probe eddy currents with varying time constants.

Making the duration ($\tau_{pre-pulse}$) of the pre-scan gradient pulse 210 long, relative to any suspected eddy currents, assures that the only observed eddy currents are generated by the ramp down of the pulse 210. In this case, eddy current behavior is measured without worrying about confusing eddy current components from the pulse ramp-up. By varying the delay, $\tau_{delay}$, between the end of the pre-scan gradient pulse 210, and the RF excitation pulse 230, the eddy current decay constants are probed. The duration of the pre-scan gradient lobe 210 was 3 s, and $\tau_{delay}$ was varied to measure the time constants. Since the image size variation along the PE direction is linearly proportional to the magnitude of the eddy current along the PE direction, the time constants of the eddy currents are determined by fitting image size variation versus $\tau_{delay}$ to an exponential curve.

Moreover, due to various asymmetries, some MRI systems may generate eddy current cross terms. For example, when the x-gradient is pulsed, it may generate a field that produces not only x-gradients, but also y- and z-gradients. In an image, for example, a pulse along the PE gradient direction may lead to a spurious gradient along the read direction that would cause shearing of the resulting image, as described by equations (12)–(13), and some signal reduction due to through plane dephasing. Optionally then, image shearing is measured, and assuming no variations in system performance, the signal from various experiments is compared to determine the magnitude of the cross terms causing through plane dephasing. Alternately, however, to probe the effect of cross terms, the pre-scan gradient pulse 210 is placed along the read or slice-select axis, and the resulting size changes are measured along the PE direction. The phase encode sizing effect is similar in sensitivity to the shearing effect, but tends to be easier to measure.

In an exemplary embodiment, the sequences developed were used to obtain images with no pre-scan gradient pulse, and with positive and negative polarity pre-scan gradient pulses along the PE direction, the read direction, and the slice select direction. The set of images obtained contain an image assumed to be free of eddy current effects and three pairs of images demonstrating phase encode size variations resulting from the correspondingly applied eddy current generating pulses for each direction. Differences in the resulting images were assumed to be the result of eddy currents induced by the pre-scan gradient lobes. Time constant measurements were made by varying $\tau_{delay}$ from 100 ms to 2 s, and measuring the sizing difference in the images. Measurements of size changes were utilized to determine the magnitude and time constants of the induced eddy currents. Moreover, subtraction images were used to observe spatial localization of the eddy currents.

The observation of spatial localization of the eddy currents is accomplished by subtracting two images, one generated with a positive polarity pre-scan gradient pulse or lobe and the other having a negative polarity pre-scan gradient pulse or lobe. Where this results in asymmetric patterns, it is determined that quadratic or otherwise non-linear eddy current effects are present. In addition, when eddy currents induce an overall shift in $B_0$ (i.e., the main magnetic field), the object shifts along the PE direction leading to a subtraction image showing asymmetric regions of positive and negative spin density along the phase encode direction. In a preferred embodiment, when the method is employed for verification, this image subtraction technique is performed to observe such spatial localization of the eddy currents if it exists.

In another alternate embodiment, the data collection pulse sequence, rather than being an EPI sequence, is any other sequence wherein the acquisition is achieved using two frequency encoding gradients to collect the data. The smaller gradient is primarily unipolar during data collection, and the magnitude of the frequency encoding gradients differ by a factor n. The factor n is the number of points sampled along each line of data in the image, and here n is the same for both orthogonal axes. Example imaging methods, other than EPI, which meet these criteria include BURST and EVI (echo volumar imaging).

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, he invention is now claimed to be:

1. A method of calibrating pre-emphasis gradient pulse conditioning for long term eddy current compensation in an MRI system comprising:

(a) positioning an object in the MRI system for imaging therewith;

(b) applying a long term eddy current generating pre-scan gradient pulse;

(c) after a delay, running an EPI sequence and acquiring a resulting image of the object;

(d) repeating steps b and c while varying the delay;

(e) observing size variations in the resulting images of the object;

(f) fitting the size variations to an exponential curve to obtain one or more time constants for the long term eddy currents;

(g) running a reference EPI sequence without applying the long term eddy current generating pre-scan gradient pulse such that a reference image of the object is acquired;

(h) applying the long term eddy current generating pre-scan gradient pulse;

(i) after a delay which is shorter than the time constants, running a test EPI sequence and acquiring a test image of the object; and, (j) repeating steps h and i while adjusting the pre-emphasis gradient pulse conditioning which is based upon the time constants obtained until the test images of the object have a size substantially equivalent to that of the reference image.

2. The method according to claim 1, wherein the method is repeated for three mutually orthogonal axes, each axis thereof being selected in turn.

3. The method according to claim 2, wherein a phase encode direction of the EPI sequence is aligned with the axis selected.

4. The method according to claim 3, wherein the long term eddy current generating pre-scan gradient pulses are applied to the axis selected.

5. The method according to claim 3, wherein the long term eddy current generating pre-scan gradient pulses are applied to one of the three mutually orthogonal axes other than the axis selected such that cross terms resulting from the long term eddy currents are observed and accounted for.

6. The method according to claim 3, wherein the observed size variations are in the phase encode direction.

7. The method according to claim 1, wherein the method excludes steps (b) through (f) and (j) and is employed to verify accurate calibration of the pre-emphasis gradient pulse conditioning by comparing sizes of the test and reference images such that when they are within a desired tolerance accurate calibration is verified.

8. The method according to claim 7, further comprising:

(k) acquiring a first subtraction image using an EPI sequence preceded by a positive polarity long term eddy current generating pre-scan gradient pulse;

(l) acquiring a second subtraction image using an EPI sequence preceded by a negative polarity long term eddy current generating pre-scan gradient pulse;

(m) subtracting the first and second subtraction images; and, (o) observing the result of step (m) to determine if the long term eddy currents exhibit any spatial localizations.

9. The method according to claim 1, wherein two time constants for the long term eddy currents are obtained.

10. In an MRI apparatus including pre-emphasis hardware which conditions electrical pulses from gradient amplifiers to suppress effects of long term eddy currents, a pre-emphasis calibration system that adjusts the conditioning performed by the pre-emphasis hardware comprising:

a sequence control circuit which manipulates a magnetic gradient generator, a radio frequency transmission system, and a radio frequency reception system to produce images of an object present in the MRI apparatus, said sequence control circuit running at least;

a plurality of EPI scans preceded by long term eddy current generating pre-scan gradient lobes; and, a reference EPI scan with no long term eddy current generating pre-scan gradient lobe; and, a pre-emphasis calibration circuit which adjusts the pre-emphasis hardware in accordance with artifacts observed in images of the object.

11. The pre-emphasis calibration system according to claim 10, wherein the pre-emphasis calibration circuit compares a reference image obtained upon the sequence control circuit running the reference EPI scan to test images obtained upon the sequence control circuit running EPI scans preceded by long term eddy current generating pre-scan gradient lobes.

12. The pre-emphasis calibration system according to claim 10, wherein the artifacts observed include size changes along a phase encode direction resulting from spurious gradients along the phase encode direction.

13. The pre-emphasis calibration system according to claim 10, wherein the artifacts observed include image shear in a phase encode direction resulting from spurious gradients along a readout direction.

14. The pre-emphasis calibration system according to claim 10, wherein time delays between the EPI scans and the preceding long term eddy current generating pre-scan gradient lobes are varied by the sequence control circuit to determine time constants for the long term eddy currents.

15. The pre-emphasis calibration system according to claim 10, wherein the long term eddy current generating pre-scan gradient lobe is applied to a phase encode direction.

16. The pre-emphasis calibration system according to claim 10, wherein the long term eddy current generating pre-scan gradient lobe is applied to other than a phase encode direction.

17. A method of calibrating pre-emphasis gradient pulse conditioning for long term eddy current compensation in an MRI system comprising:

(a) positioning an object in the MRI system for imaging therewith;

(b) applying a long term eddy current generating pre-scan gradient pulse;

(c) after a delay, running an imaging sequence and acquiring a resulting image of the object;

(d) repeating steps b and c while varying the delay;

(e) observing size variations in the resulting images of the object;

(f) fitting the size variations to an exponential curve to obtain one or more time constants for the long term eddy currents;

(g) running a reference imaging sequence without applying the long term eddy current generating pre-scan gradient pulse such that a reference image of the object is acquired;

(h) applying the long term eddy current generating pre-scan gradient pulse;

(i) after a delay which is shorter than the time constants, running a test imaging sequence and acquiring a test image of the object; and, (j) repeating steps h and i while adjusting the pre-emphasis gradient pulse conditioning which is based upon the time constants obtained until the test images of the object have a size substantially equivalent to that of the reference image.

18. The method according to claim 17, wherein the imaging sequence is selected from a group consisting of BURST, EPI, and EVI imaging sequences.

19. The method according to claim 17, wherein the imaging sequence includes during data acquisition two frequency encoding gradients the smaller of which is unipolar, said two frequency encoding gradients differing in size by a factor n where n is the number of points sampled along each line of data in the image.

\* \* \* \* \*